(12) United States Patent
Kessler et al.

(10) Patent No.: US 6,469,536 B1
(45) Date of Patent: Oct. 22, 2002

(54) METHOD AND DEVICE FOR PROVIDING SYMETRICAL MONITORING OF ESD TESTING AN INTEGRATED CIRCUIT

(75) Inventors: Thomas Kessler, Munich; Andreas Tausch, Markt Schwaben; Fabian Kederer, Poppenricht, all of (DE)

(73) Assignee: Motorola, Inc., Schaumburg, IL (US)

( * ) Notice: Subject to any disclaimer, the term of this patent is extended or adjusted under 35 U.S.C. 154(b) by 31 days.

(21) Appl. No.: 09/690,666

(22) Filed: Oct. 17, 2000

(51) Int. Cl.[7] .............................................. G01R 31/26
(52) U.S. Cl. ...................................... 324/765; 324/750
(58) Field of Search ................................. 324/750, 751, 324/752, 501; 358/79, 126; 356/311, 328, 417, 418

(56) References Cited

U.S. PATENT DOCUMENTS

| | | | | |
|---|---|---|---|---|
| 4,680,635 A | * | 7/1987 | Khurama | 348/79 |
| 4,755,874 A | * | 7/1988 | Esrig et al. | 348/126 |
| 5,270,655 A | * | 12/1993 | Tomita | 324/501 |
| 5,301,006 A | * | 4/1994 | Bruce | 356/311 |

* cited by examiner

*Primary Examiner*—Vinh P. Nguyen

(57) ABSTRACT

A method and a device (4) for testing an integrated circuit (DUT) uses a stress signal and surface monitoring. A stress signal generator (5) is connected to the integrated circuit (DUT) to apply the stress signal (v(t)) to the integrated circuit. A failure is observed in real time by monitoring the surface (6) of the integrated circuit (DUT) during a monitoring time window ($\Delta T$) by an emission microscope (10) having a controllable shutter (15). The time window has a predetermined relation with respect to the duration of the stress signal.

9 Claims, 2 Drawing Sheets

-PRIOR ART-

METHOD AND DEVICE FOR PROVIDING SYMETRICAL MONITORING OF ESD TESTING AN INTEGRATED CIRCUIT

FIELD OF THE INVENTION

The present invention generally relates to a method and device for testing an integrated circuit.

BACKGROUND OF THE INVENTION

For semiconductor integrated circuits, generally new chip designs have to fulfill certain electrostatic discharge criteria. For evaluating the robustness of the integrated circuits, dedicated testing is performed wherein predetermined stress signals are applied to a device under test. A stress source is used to generate the transient, which propagates from a pad or pin of the device under test to another terminal. The failures, which may occur during testing, are often only locatable with severe difficulties. In other words, thorough investigations of the damaged integrated circuits have to be performed in order to locate the defective area(s) of the integrated circuit. However, in order to design more robust structures, the knowledge about the exact location of the defects and the corresponding failure mechanism is absolutely necessary.

Electrostatic discharge (ESD) together with electrical overstress cause about 35% of all integrated circuit failures. ESD can occur for example by touching a circuit while installing it onto a printed circuit board or similar. The design efforts in order to reduce these electrostatic discharge failures amount to several million dollars a year. Besides engineer hours and the corresponding resources, material costs, for example masks, become necessary. Moreover, ESD problems often prevent short product development times.

The present invention seeks to provide to a method and device for testing integrated circuits, which mitigate or avoid problems and other disadvantages and limitations of the prior art.

DETAILED DESCRIPTION OF THE DRAWINGS

Throughout the FIG. the same reference signs denote the same or equivalent parts.

Figure 1:
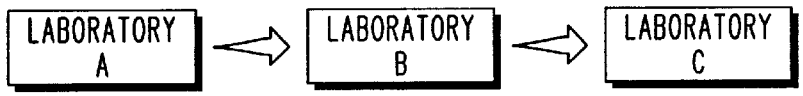
FIG. 1 is a flow chart for illustrating a known method for testing an integrated circuit.

FIG. 1 shows a flow chart for illustrating a common approach for testing an integrated circuit. In the known testing method, ESD stress tests are performed in laboratory A with levels according to certain qualification standards using the stress signal generating circuit shown in FIG. 6 to be explained below. The device is stressed by applying short pulses of certain energy levels.

Then the integrated circuit is carried to laboratory B where an automated test is performed to verify the functionality and in case of device failure determine the failure mode under normal device operation.

Finally, the failure analysis is performed in laboratory C e.g. by infrared spectroscopy. Defective sites tend to emit radiation in a wider spectrum. In various cases, emission microscopy cannot detect the defective site during normal device operation. Side effects might occur or secondary effects (to be explained below) might overrule this primary damage.

Figure 2:
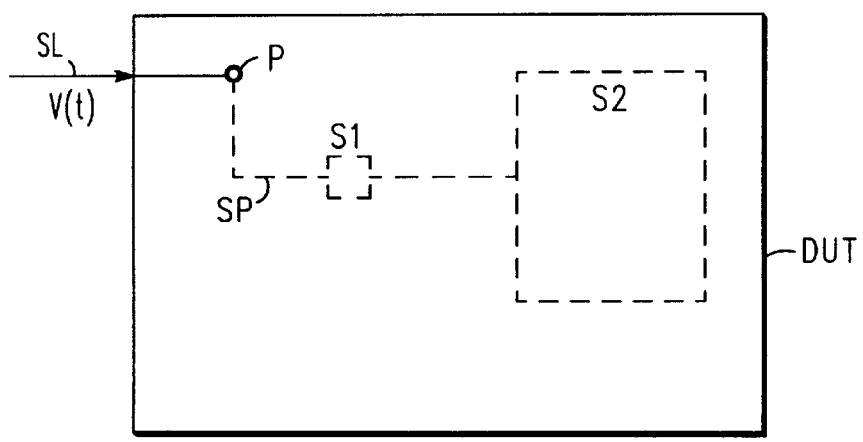
FIG. 2 shows a schematic illustration of a device under test.

FIG. 2 shows a schematic illustration of a device during analysis in laboratory C. Here it becomes apparent that the common approach may not allow to distinguish between primary and secondary effects. The device is under normal operating conditions. The integrated circuit was previously (in laboratory A) damaged by the transient stress signal v(t) that propagated via the signal path SP through a first element S1 and caused a destruction there. This destruction may cause a malfunction of a completely different circuitry S2 as a secondary effect resulting from the primary damage. The secondary effect may impede the fault site detection and mislead the process of determining the failure mechanism.

Thus, the known method does not allow to easily distinguish between these primary and secondary effects.

The general idea underlying the present invention is that by monitoring a surface of the integrated circuit in a monitoring time window having a predetermined relation with respect to a duration of the stress signal, a failure of a component may be observed in real time which may also be called Live Zap. Monitoring has the meaning of sensing any kind of emission of radiation and/or particles, e.g. optical or infrared emission by a suitable monitoring device. Thus, the present invention provides a device and method for instantaneous localization of high voltage transient damage on integrated circuits. The method according to the present invention makes burdensome reverse engineering (fault site localization) steps superfluous.

Thus, the present invention provides an easy detection method and device for defects caused by high voltage transients, such as ESD, using emission microscopy. The invention eliminates the "after the event" damage site search by live imaging of the destruction. Thus, the event itself is visualized, during the exceptional condition instead of traced by searching defective areas post mortem being limited by normal device operation. Compared to the known method, the Live Zap methodology according to the invention allows performing the test and finding the defective areas in one single step and respectively one single machine/laboratory.

Thus there is immediate knowledge of the failing structures, no waiting for test and analysis results, a clearer differentiation between primary and secondary effects, a better use of engineering resources, an improved redesign cycle time, a quicker time to market and improved product quality.

Figure 3:
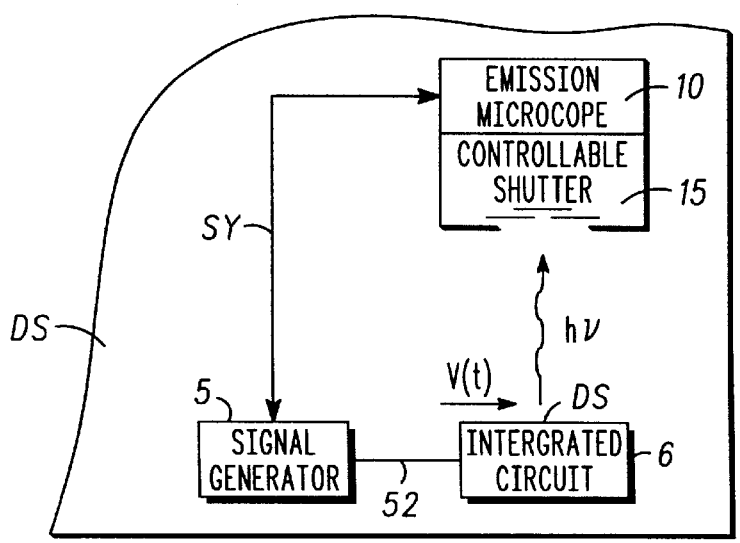
FIG. 3 is a schematic illustration of a testing arrangement according to a preferred embodiment of the present invention.

FIG. 3 is a schematic illustration of a testing arrangement ("device for testing") according to a preferred embodiment of the present Invention.

In FIG. 3, DUT denotes a device under test in form of an integrated circuit with the semiconductor surface 6 exposed.

5 is a stress signal generating device connected to a pad or pin of the device under test DUT. This stress signal generating device 5 applies the stress signal v(t), i.e. a timely varying test voltage, to the integrated circuit. Moreover, the stress signal generating device 5 is arranged for generating a control signal SY which is connected to a CCD-camera 10 (charge coupled device CCD). CCD-camera 10 has a controllable shutter 15. The control signal SY is used for synchronizing the opening time of the controllable shutter 15 in order to correlate this opening time to the voltage transient v(t), namely the stress signal.

The sensitivity of the CCD-camera 10 is nearly constant in the range up to a wavelength of 1 $\mu$m and then steadily decreases to 0. If a CCD-camera based on silicon is used, this sensitivity range amounts to 1050 nm corresponding to the band gap of silicon of 1.12 eV. Preferably, the arrangement of FIG. 3 is located in a dark chamber DC (details below, cf. FIG. 5).

Figure 4:
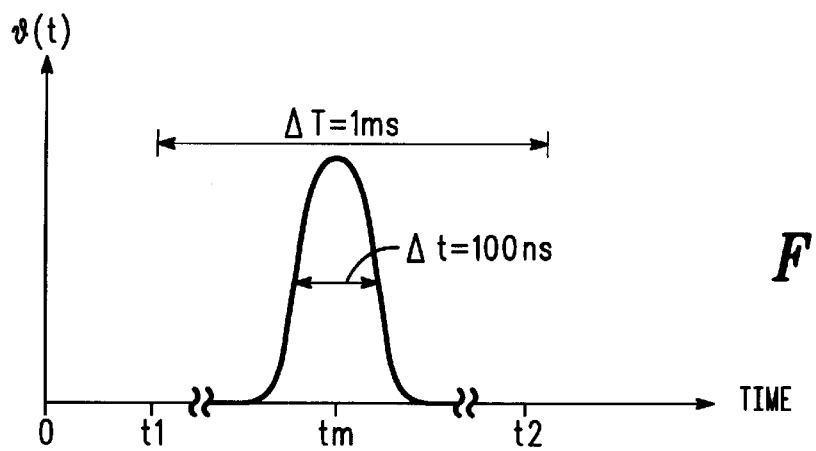
FIG. 4 depicts a time graph for illustrating the time dependence of a monitoring time window and the duration of a stress signal.

FIG. 4 depicts a time graph for illustrating the time dependence of the monitoring time window and the duration of the stress signal. As depicted in FIG. 4, the test procedure is started at t=0. After a certain time delay, at time point t1 the shutter 15 is opened for a monitoring time interval $\Delta$T of 1 ms. Centered in that monitoring time interval $\Delta$T is the duration $\Delta$t of the stress signal v(t) which amounts to 100 ns (full width half maximum). Finally, at the time point t2 the shutter is closed again.

If during monitoring time interval $\Delta$T, a defect DS occurs at a component of the integrated circuit, a light ray hv is emitted by the device under test and sent by CCD camera 10. I.e. the transient formed by the stress signal generating device 5 shown in FIG. 6 damages the device under test DUT, and the energy dissipated during this event causes emission of the light ray hv which can be monitored by the synchronized CCD-camera 10.

Therefore, the CCD-camera 10 is designed to observe a certain area of the surface of the device under test having a spatial resolution of 1 $\mu$m. Moreover, in order to avoid noise effects from the environment, the whole testing arrangement is placed in a dark chamber.

Thus, the defect site or damage site DS may be observed as a light area in the integrated image of the CCD-camera 10 and this image enables an accurate determination of the defect location under real time conditions.

Figure 5:
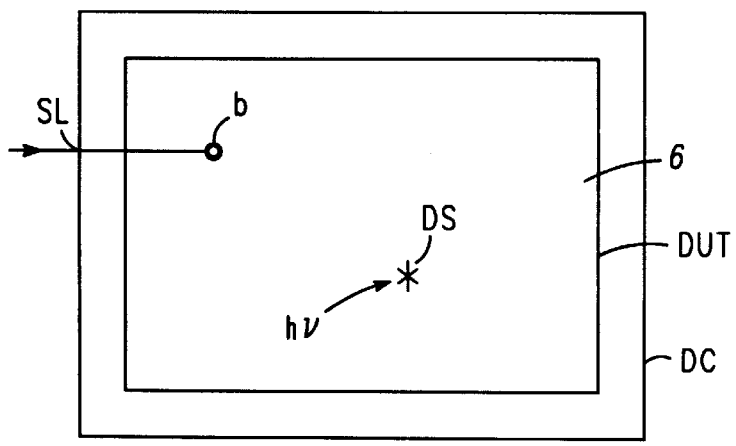
FIG. 5 shows a plane view of the upper surface of the device under test when testing is performed for illustrating the effect to be observed in case of failure of a component.

FIG. 5 shows a plane view of the upper surface 6 of the device under test when testing is performed for illustrating the effect to be observed in case of failure of a component. As becomes readily apparent from FIG. 3, the defect site DS is clearly visible on the photograph as a light spot emitting a light ray hv. DC stands for the dark chamber.

Figure 6:
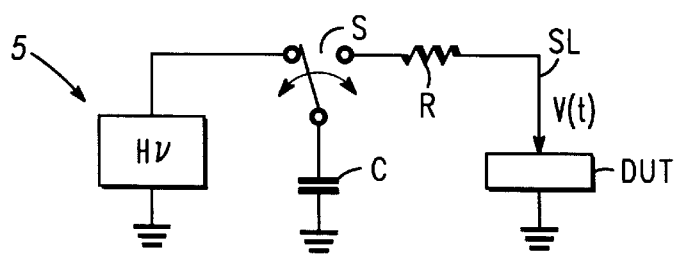
FIG. 6 is a block diagram for showing an example of the stress signal generating device connected to the device under test.

FIG. 6 is a block diagram for showing an example of the stress signal generating device connected to the device under test. The stress signal generating device 5 shown in FIG. 6 comprises an RC circuit having a series arrangement of a capacitor C connected to ground and a resistor R connected to the device under test by a signal line SL where the stress signal v(t) is applied to the device under test, for example by a needle probe or by a connector to a pin or a pad. In the circuit shown in FIG. 6, the typical value of the capacitance of the capacitor C is 100 pF, and a typical value of the resistance of the resistor R is 1.5 k$\Omega$.

The capacitor can be switched by a switch S to a high voltage source of for example 300 V. GND in FIG. 6 means a reference potential or ground. After the capacitor C is charged, the testing may be initiated by switching the switch S from the voltage source HV to the node connected to the resistor R. This switch is connected to a not shown internal control circuit for generating the control signal SY which is transmitted to the shutter 15 of the CCD-camera 10 in order to have the time dependence of the monitoring window $\Delta$T and the stress duration (t) as shown in FIG. 4.

Although the present invention has been explained with a galvanic coupling of the stress signal to the device under test, it is of course possible to use an inductive or capacitive coupling. Moreover, the invention is not restricted to the monitoring and detection of light radiation, but can also be used with any other kind of radiation.

Moreover, the term integrated circuit should comprise any circuit element combination integrated in a suited carrier material, and not only semiconductor integrated circuits.

Figure 7:
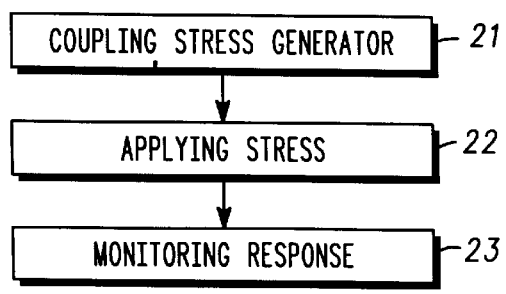
FIG. 7 is a simplified flow chart diagram of a test method according to the present invention.

FIG. 7 is a simplified flow chart diagram of test method 20 according to the present invention. Method 20 comprises the steps of coupling 21 a stress signal generating device to the integrated circuit; applying 22 a stress signal to the integrated circuit by the stress signal generating device; and monitoring 23 the surface of the integrated circuit in a monitoring time window having a predetermined relation with respect to the duration of the stress signal.

In accordance with another aspect of the present invention, a device 4 for testing an integrated circuit comprises a stress signal generating device 5 connected to the integrated circuit DUT for applying a stress signal v(t) to the integrated circuit; and a monitoring device 10 for monitoring the surface 6 of the integrated circuit in a monitoring time window $\Delta$T that covers at least the duration $\Delta$t of the stress signal.

According to the preferred embodiment, the monitoring time window covers at least the duration of the stress signal. Of course, if desired, also a certain delay may be introduced. Also, the monitoring time window can start before and can end after the stress application, however, care must be taken because of noise effects.

According to another preferred embodiment, monitoring is performed by a emission microscope which comprises a controllable shutter for opening and shutting a viewing field of the emission microscope, wherein the shutter is opened during the monitoring time window.

According to another preferred embodiment, the stress signal generating device is arranged for generating a control signal which is connected to the controllable shutter, and the control signal is used for synchronizing the monitoring time window to cover at least the duration of the stress signal.

According to another preferred embodiment, the monitoring time window is larger than the stress duration and the stress duration is substantially centered in the monitoring time window.

According to another preferred embodiment, the monitoring time window is about 1 ms and the stress duration is about 100 ns.

According to another preferred embodiment, the monitoring device is a microscope utilizing a CCD-camera achieving a spatial resolution of the order of 1 $\mu$m.

According to another preferred embodiment, the stress signal generating device comprises a RC circuit having at least one resistor and one capacitor, the RC circuit being connected to a pad of the integrated circuit, and the capacitor of the RC circuit being chargeable by a switchable voltage source.

While the invention has been described in terms of particular structures, devices and methods, those of skill in the art will understand based on the description herein that it is not limited merely to such examples and that the full scope of the invention is properly determined by the claims that follow.

What is claimed is:

1. A method for testing an integrated circuit comprising the steps of:
    coupling to a predetermined node of the integrated circuit a voltage source that provides a time varying single pulse stress voltage that is sufficiently high in magnitude to test electrostatic discharge criteria of said integrated circuit;
    applying the time varying single pulse stress voltage to said integrated circuit; and
    monitoring with a camera in a dark chamber a surface of said integrated circuit in a monitoring time window that is coincident with and longer in time than a stress duration of said time varying single pulse stress voltage, the stress duration being substantially centered in the monitoring time window, the voltage source also providing a control signal to determine the monitoring time window.

2. The method according to claim 1, wherein in said monitoring step, said monitoring time window covers approximately 1 ms and said stress duration covers approximately 100 ns.

3. The method according to claim 1, wherein said monitoring is performed using an emission microscope which comprises a controllable shutter for shutting and opening a viewing field of said emission microscope, said shutter being opened in said monitoring time window.

4. The method according to claim 1 wherein applying the time varying single pulse stress voltage further comprises providing a capacitor having a first electrode connected to a reference terminal and having a second electrode, providing a switch having a first terminal connected to the second electrode of the capacitor and having a second terminal alternately connected between the voltage source and a switch node, and providing a resistor having a first terminal connected to the switch node and having a second terminal coupled to the predetermined node of the integrated circuit.

5. A device for testing an integrated circuit comprising:
    a stress signal generating device connected to said integrated circuit for applying a stress signal to said integrated circuit; and
    a monitoring device for monitoring a surface of said integrated circuit in a monitoring time window covering at least a stress duration of said stress signal.

6. The device according to claim 5, wherein said monitoring device is an emission microscope which comprises a controllable shutter for shutting and opening a viewing field of said emission microscope, said shutter being arranged to be opened in said monitoring time window.

7. The device according to claim 6, wherein said stress signal generating device is arranged for generating a control signal which is connected to said controllable shutter for synchronizing said monitoring time window to cover at least said stress duration of said stress signal.

8. The device according to claim 5, said monitoring device is a CCD-camera having a spatial resolution of the order of 1 $\mu$m.

9. The device according to claim 5 wherein said stress signal generating device comprises an RC circuit having at least one resistor and one capacitor, said RC circuit being connected to a pad of said integrated circuit, and said capacitor of said RC circuit being chargeable by a switchable voltage source.

* * * * *

UNITED STATES PATENT AND TRADEMARK OFFICE
CERTIFICATE OF CORRECTION

PATENT NO. : 6,469,536 B1
DATED : October 22, 2002
INVENTOR(S) : Kessler et al.

It is certified that error appears in the above-identified patent and that said Letters Patent is hereby corrected as shown below:

<u>Title page, Item [54] and Column 1, line 3,</u>
In the title, insert -- OF -- after testing.

<u>Column 5,</u>
Line 25, change "1 ms" to -- 1ms --.
Line 26, change "100 ns" to -- 100ns --.

<u>Column 6,</u>
Line 8, change "stress" to -- voltage --.
Line 8, insert -- a predetermined node of -- after "connected to".
Line 9, insert -- time varying single pulse -- after "applying a".
Line 9, insert -- voltage -- after "stress".
Line 10, insert -- , the time varying single pulse stress voltage having a magnitude that is sufficiently high to test electrostatic discharge criteria of said integrated circuit; -- after "circuit".
Line 10, delete "and".
Line 12, replace "covering at least" with -- that is coincident with and longer in time than --.
Line 13, insert -- time varying single pulse -- after "said".
Line 14, insert -- the voltage signal generating device being connected to the monitoring device for providing a control signal to the monitoring device for controlling the monitoring time window to substantially center the stress duration within the monitoring time window; and a dark chamber that surrounds the integrated circuit and blocks light from the monitoring device other than light originating from the surface of the integrated circuit -- after "said".
Line 20, replace "stress" with -- voltage --.
Line 21, replace "is arranged for generating a control signal which is connected to said controllable shutter for synchronizing said monitoring time window to cover at least said stress duration of said stress signal" with -- sets the monitoring time window to be substantially 1ms in duration and the time varying single pulse stress signal is substantially 100ns in duration --.
Line 28, replace "The device according to claim 5" with -- A device for testing an integrated circuit comprising: a voltage signal generating device connected to a predetermined node of said integrated circuit for applying a time varying single pulse stress voltage signal to said integrated circuit, the time varying single pulse stress voltage having a magnitude that is sufficiently high to test electrostatic discharge criteria of said integrated circuit; a monitoring device for monitoring a surface of said integrated circuit in a monitoring time window that is coincident with and longer in time than a stress duration of said time varying single pulse stress signal, the voltage signal generating device being connected to the monitoring device for providing a control signal to the monitoring device for controlling the monitoring time window to

UNITED STATES PATENT AND TRADEMARK OFFICE
CERTIFICATE OF CORRECTION

PATENT NO. : 6,469,536 B1
DATED : October 22, 2002
INVENTOR(S) : Kessler et al.

It is certified that error appears in the above-identified patent and that said Letters Patent is hereby corrected as shown below:

<u>Column 6, cont'd</u>
substantially center the stress duration within the monitoring time window; and a dark chamber that surrounds the integrated circuit and blocks light from the monitoring device other than light originating from the surface of the integrated circuit --
Line 28, replace "stress" with -- voltage --.
Line 31, replace "a pad" with -- the predetermined node --.

Signed and Sealed this

Nineteenth Day of August, 2003

JAMES E. ROGAN
*Director of the United States Patent and Trademark Office*